US006483228B2

(12) United States Patent
Hashimoto

(10) Patent No.: US 6,483,228 B2

(45) Date of Patent: Nov. 19, 2002

(54) SENSOR ARRAY AND TRANSMITTING/ RECEIVING DEVICE

(75) Inventor: Junichi Hashimoto, Otsu (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 09/927,061

(22) Filed: Aug. 9, 2001

(65) Prior Publication Data

US 2002/0043896 A1 Apr. 18, 2002

(30) Foreign Application Priority Data

Aug. 11, 2000 (JP) ....................................... 2000-244270

(51) Int. Cl.[7] ................................................ H01L 41/04

(52) U.S. Cl. ....................................................... 310/336

(58) Field of Search ................................ 310/334, 336, 310/322

(56) References Cited

U.S. PATENT DOCUMENTS

| | | | | | |
|---|---|---|---|---|---|
| 2,484,626 | A | * | 10/1949 | Keller | 310/322 |
| 2,601,300 | A | * | 6/1952 | Klein | 310/337 |
| 3,964,014 | A | * | 6/1976 | Tehon | 310/322 |
| 4,677,337 | A | * | 6/1987 | Kleinschmidt et al. | 310/326 |
| 4,890,268 | A | * | 12/1989 | Smith et al. | 310/334 |
| 4,914,565 | A | * | 4/1990 | Schnoeller et al. | 310/366 |
| 5,187,403 | A | * | 2/1993 | Larson, III | 310/334 |
| 6,104,126 | A | * | 8/2000 | Gilmore | 310/334 |
| 6,225,728 | B1 | * | 5/2001 | Gururaja | 310/334 |
| 6,288,477 | B1 | * | 9/2001 | Gilmore et al. | 310/334 |

FOREIGN PATENT DOCUMENTS

JP 103600 4/2001

OTHER PUBLICATIONS

Article entitled "Hybrid Multi–Single Layer Array Transducers for Increased Signal–to–Noise Ratio", IEEE Transactions on Ultrasonics, Ferroelectrics, and Frequency Control, vol. 44, No. 2, Mar. 1997, pp 315–325.

* cited by examiner

*Primary Examiner*—Karl Tamai
*Assistant Examiner*—Peter Medley
(74) *Attorney, Agent, or Firm*—Keating & Bennett, LLP

(57) ABSTRACT

An ultrasonic probe serving as a sensor array used in a transmitting/receiving device includes a substrate made of a packing material. A plurality of piezoelectric vibrators shaped like a rectangular parallelepiped are fixed in a matrix on one principal surface of the substrate. Each of the piezoelectric vibrators includes a plurality of piezoelectric layers stacked in a direction that crosses two adjoining side faces of the piezoelectric vibrator at an angle of approximately 45°. Inner electrodes are formed between the piezoelectric layers, and outer electrodes are formed on both end faces of the piezoelectric layers.

5 Claims, 7 Drawing Sheets

26

SENSOR ARRAY AND TRANSMITTING/ RECEIVING DEVICE

BACKGROUND OF THE INVENTION

1. Field of the Invention

The present invention relates to a sensor array and a transmitting/receiving device, and more particularly, to a sensor array, such as an ultrasonic probe for use in an ultrasonic diagnostic device, an ultrasonic microscope, a metal flaw detector, and the like, and to a transmitting/ receiving device.

2. Description of the Related Art

As the background of the present invention, an ultrasonic probe or the like used in a conventional ultrasonic diagnostic device is disclosed in, for example, "Hybrid Multi/Single Layer Array Transducers for Increased Signal-to-Noise Ratio", *IEEE Transactions on Ultrasonics, Ferroelectrics, and Frequency Control,* Vol. 44, No. 2, March 1997.

FIG. 9 is a perspective view showing the principal part of an ultrasonic probe used in a conventional ultrasonic diagnostic device, and FIG. 10 is a perspective view of a piezoelectric vibrator used in the ultrasonic probe. An ultrasonic probe 1 shown in FIG. 9 includes a substrate 2 made of a sound-absorbing material called a "packing material". A plurality of piezoelectric vibrators 3 are fixed in a matrix onto one principal surface of the substrate 2.

Each piezoelectric vibrator 3 includes a plurality of stacked piezoelectric layers 4, as shown in FIG. 10. Inner electrodes 5 are formed between the piezoelectric layers 4, and outer electrodes 6 are formed on the uppermost and lowermost surfaces of the piezoelectric layers 4. Via holes 7 are formed at both ends of the piezoelectric layers 4, and connecting electrodes 8 are formed in each of the via holes 7. The piezoelectric layers 4 are alternately polarized in opposite thickness directions. The piezoelectric vibrators 3 are bonded on one principal surface of the substrate 2 with an adhesive so that the principal surfaces of the piezoelectric layers 4 are placed in parallel therewith.

Furthermore, an acoustic matched layer 9 is formed on the piezoelectric vibrators 3 so as to establish an acoustic matching with the human body, and an acoustic lens 10 is formed on the acoustic matched layer 9 so as to converge the ultrasonic waves.

While the inner electrodes 5 are led out by the via holes 7 in the piezoelectric vibrators 3 used in the above-described ultrasonic probe 1, they may be led out from the side faces as in a general type of multilayer capacitor and the like.

Since the piezoelectric vibrators 3 used in the ultrasonic probe 1 shown in FIG. 9 do not have a single-layer structure, but have a multilayer structure, functions and resolution can be improved, and sensitivity is high. However, a high machining accuracy for the via holes and a high printing accuracy for the electrodes are required during production, and it is difficult to align the via holes due to the contraction of the material when being fired and to cut the fired material into a matrix. Moreover, the outer electrodes are prone to fall off after cutting. Accordingly, an extremely high machining accuracy is necessary during production, so there are many problems in production, and the characteristics are prone to vary.

When the inner electrodes 5 of the piezoelectric vibrators 3 in the ultrasonic probe 1 are led out from the side faces, a high machining accuracy is also necessary during production.

Accordingly, a highly sensitive ultrasonic probe, which is easily produced, has been invented, as in Japanese Patent Application No. 11-273078 of the present applicant. FIG. 11 is a perspective view showing the principal part of such an ultrasonic probe, and FIG. 12 is a perspective view of a piezoelectric vibrator used in the ultrasonic probe. An ultrasonic probe 1 shown in FIG. 11 is different from the ultrasonic probe 1 shown in FIG. 9 particularly in the piezoelectric vibrators 3. That is, while the piezoelectric layers 4 and the inner electrodes 5 are vertically stacked on one principal surface of the substrate 2 in the piezoelectric vibrators 3 of the ultrasonic probe 1 shown in FIG. 9, piezoelectric layers 4 and inner electrodes 5 are stacked in a direction parallel to the side faces of the piezoelectric vibrator 3 in the ultrasonic probe 1 shown in FIG. 11.

The ultrasonic probe shown in FIG. 11 is also highly sensitive because the piezoelectric vibrators having a layered structure are used.

The ultrasonic probe shown in FIG. 11 can be produced by making a laminated member by stacking a plurality of piezoelectric layers and a plurality of inner electrodes, cutting the laminated member in the stacking direction to form a plate like motherboard, forming outer electrodes on principal surfaces of the motherboard, fixing the motherboard on one principal surface of the substrate, and cutting the motherboard into a plurality of piezoelectric vibrators. Since the outer electrodes are formed on the entire principal surfaces of the motherboard, a high positioning accuracy is unnecessary when fixing the motherboard onto the substrate, and this facilitates production.

In the ultrasonic probe shown in FIG. 11, however, the thicknesses of the piezoelectric layers constituting the piezoelectric vibrators vary and cannot be fixed.

In order to produce piezoelectric vibrators of a fixed shape, it is necessary to decrease and adjust the thicknesses of the piezoelectric layers disposed on the sides of the piezoelectric vibrators. In this case, it is impossible to apply a voltage to the piezoelectric layers on the sides because they do not have any electrodes on their outer sides, and this is a component that damps vibration. The damping component has a great influence on the entire device, and is also the principal factor that decreases efficiency.

Moreover, since the thicknesses of the piezoelectric layers on the sides vary among the piezoelectric vibrators, the characteristics also significantly vary among the piezoelectric vibrators.

SUMMARY OF THE INVENTION

Accordingly, a main object of the present invention is to provide a highly sensitive sensor array which can be easily produced and in which variations in the characteristics among piezoelectric vibrators are limited.

Another object of the present invention is to provide a transmitting/receiving device including a highly sensitive sensor array which can be easily produced and in which variations in the characteristics among piezoelectric vibrators are limited.

In order to achieve the above objects, according to an aspect of the present invention, there is provided a sensor array including a substrate, and a plurality of piezoelectric vibrators having a rectangular parallelepiped shape and fixed in a matrix on a principal surface of the substrate, wherein each of the piezoelectric vibrators includes a plurality of piezoelectric layers stacked in a direction parallel to the principal surface of the substrate, at least some of the piezoelectric layers being stacked in a direction crossing two adjacent side faces of the piezoelectric vibrator, inner electrodes disposed between the piezoelectric layers, and outer electrodes provided on end faces of the piezoelectric layers.

Preferably, the piezoelectric layers are stacked in a direction crossing two adjacent side faces of the piezoelectric vibrator at approximately 45°.

According to another aspect of the present invention, there is provided a transmitting/receiving device including the above sensor array.

The sensor array of the present invention is highly sensitive because the piezoelectric vibrators having a layered structure are used.

The sensor array can be produced by making a laminated member by stacking a plurality of piezoelectric layers and a plurality of inner electrodes, cutting the laminated member in the stacking direction to form a platelike motherboard, forming outer electrodes on principal surfaces of the motherboard, and fixing the motherboard on one principal surface of the substrate. Since the outer electrodes are formed on the entire principal surfaces of the motherboard, a high positioning accuracy is unnecessary when fixing the motherboard onto the substrate, and this facilitates production.

Since at least some of the piezoelectric layers and the inner electrodes are stacked in parallel with the principal surfaces of the substrate and in a direction crossing two adjoining side faces of the piezoelectric vibrators, the area of the end faces of the outermost piezoelectric layers in the piezoelectric vibrators, which do not show piezoelectricity, is reduced. For this reason, the factor that damps vibration in the outermost piezoelectric layers of the piezoelectric vibrators is reduced, and the influence of the variations in thickness among the outermost piezoelectric layers of the piezoelectric vibrators on the characteristics of the piezoelectric vibrators is lessened. Therefore, variations in the characteristics among the piezoelectric vibrators are limited.

The above objects, further objects, features and advantages of the present invention will become more apparent from the following detailed description of the embodiments of the present invention with reference to the drawings.

DESCRIPTION OF THE PREFERRED EMBODIMENTS

Figure 1:
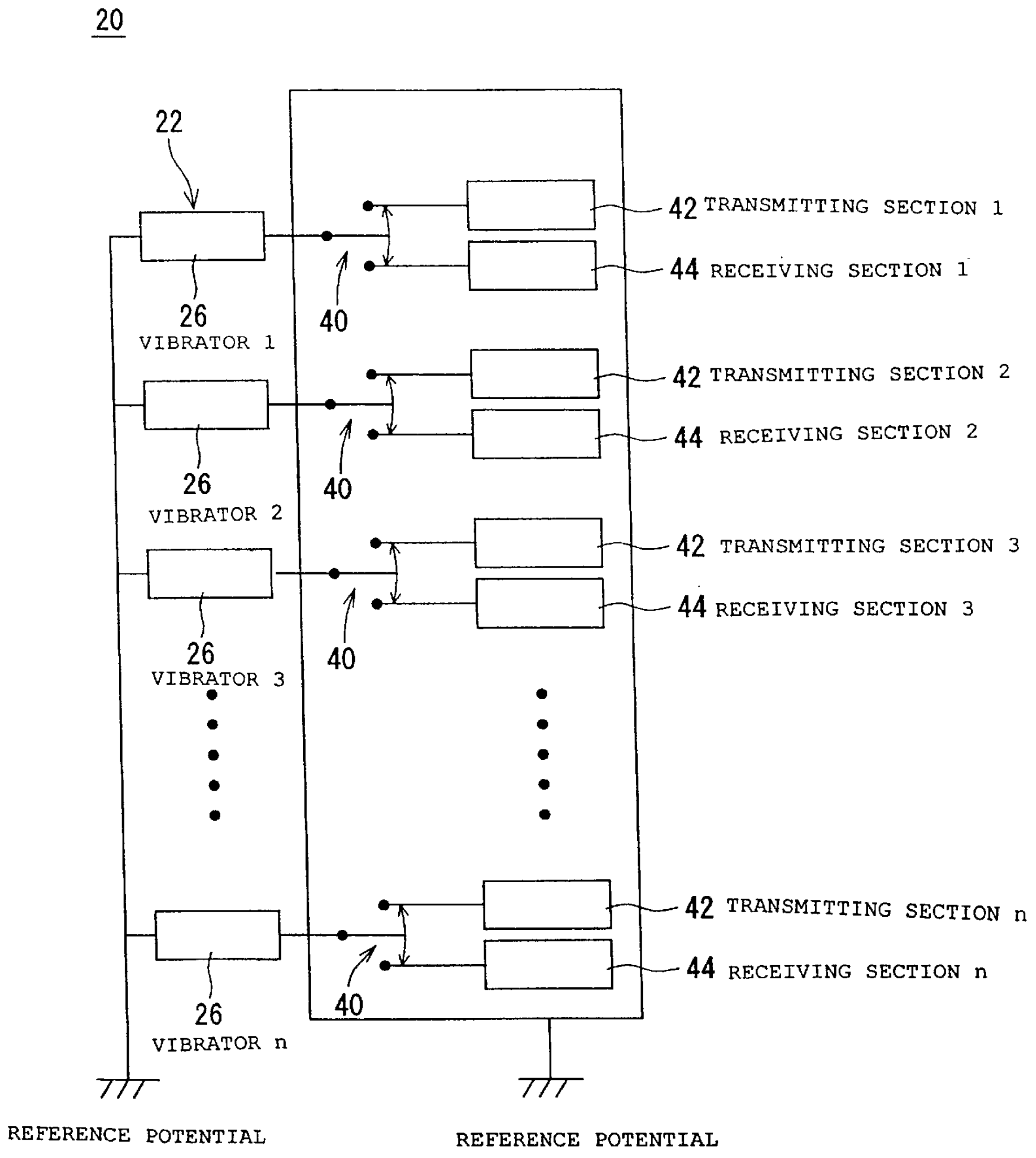
FIG. 1 is a block diagram of a transmitting/receiving device according to an embodiment of the present invention.
Figure 2:
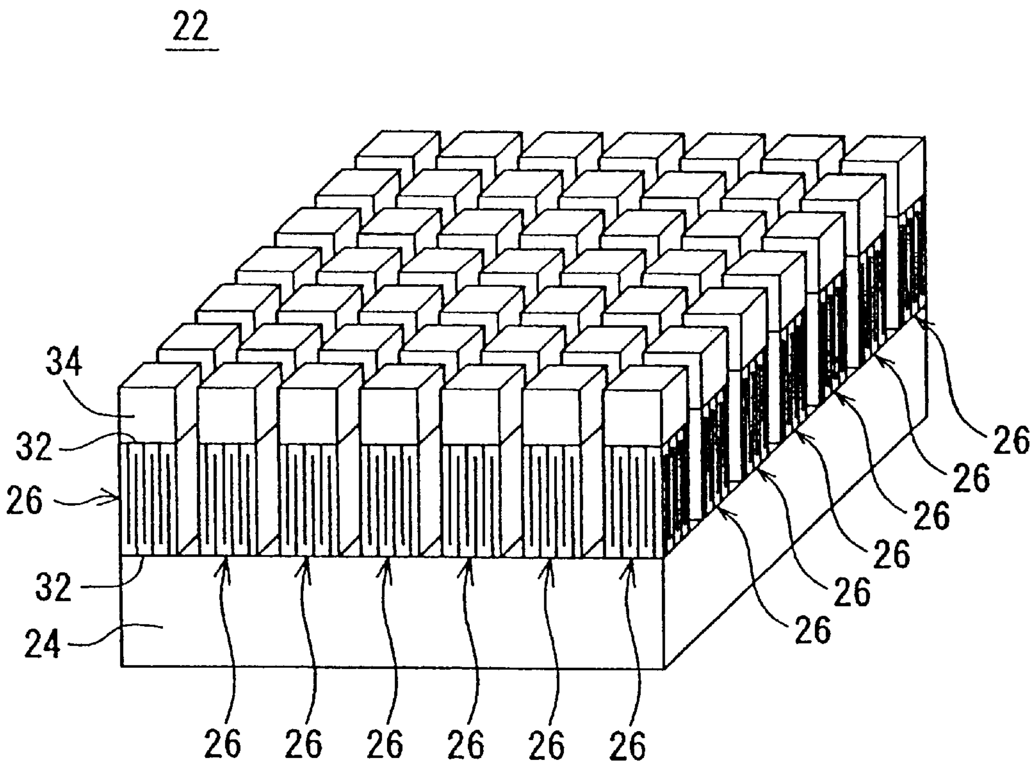
FIG. 2 is a perspective view of an ultrasonic probe used in the transmitting/receiving device shown in FIG. 1.
Figure 3:
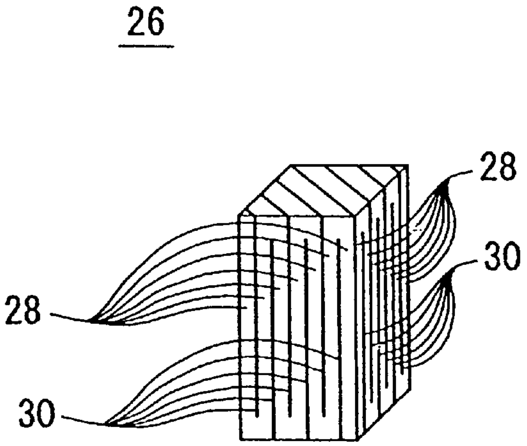
FIG. 3 is a perspective view of a piezoelectric vibrator used in the ultrasonic probe shown in FIG. 2.

FIG. 1 is a block diagram of a transmitting/receiving device according to an embodiment of the present invention, FIG. 2 is a perspective view of an ultrasonic probe used in the transmitting/receiving device, and FIG. 3 is a perspective view of a piezoelectric vibrator used in the ultrasonic probe. A transmitting/receiving device 20 shown in FIG. 1 includes an ultrasonic probe 22.

As shown in FIG. 2, the ultrasonic probe 22 includes a substrate 24 made of a sound-absorbing material called a "packing material". A plurality of piezoelectric vibrators 26 shaped like a rectangular parallelepiped are fixed in a matrix on one principal surface of the substrate 24. The piezoelectric vibrators 26 have, for example, a length of 0.35 mm, a width of 0.35 mm, and a height of 0.7 mm. While the piezoelectric vibrators 26 are arranged in seven rows and seven columns in FIG. 2, in actuality, more piezoelectric vibrators are arranged.

Each of the piezoelectric vibrators 26 includes a plurality of stacked piezoelectric layers 28 made of a material having a relative dielectric constant of, for example, approximately 2000, as shown in FIG. 3. Each of the piezoelectric layers 28 has a thickness of, for example, 40 $\mu$m. The piezoelectric layers 28 are stacked in a direction that crosses two adjoining side faces of the piezoelectric vibrator 26 at approximately 45°. Inner electrodes 30 having a thickness of, for example, 3 $\mu$m are formed between the piezoelectric layers 28. In this case, the inner electrodes 30 alternately extend from one end portions to the center portions of the piezoelectric layers 28 and from the other end portions to the center portions. Outer electrodes 32 are formed on both end faces of the piezoelectric layers 32. In this case, one of the outer electrodes 32 is connected to the alternate inner electrodes 32, and the other outer electrode 32 is connected to the other alternate inner electrodes 30. The piezoelectric layers 28 are alternately polarized in opposite thickness directions. The outer size of each piezoelectric vibrator 26, that is, the length of one side of the outer electrode 32, is 0.35 mm. In order to prevent longitudinal vibration (d31 mode) serving as the principal mode and other unnecessary vibrations from being coupled, it is preferable that the thickness, that is, the distance between the outer electrodes 32, be more than double the outer size, for example, be 0.7 mm. The piezoelectric vibrators 26 are bonded in a matrix onto the substrate 24 with an adhesive so that the piezoelectric layers 28 are stacked in parallel with the principal surface of the substrate 24.

Leads which allow electric signals to be input and output to and from the piezoelectric vibrators 26 are connected to the outer electrodes 32 on the bonded sides of the piezoelectric vibrators 26 so that they are electrically independent of one another. The leads extend out from the rear surface of the substrate 24 therethrough.

A conductive thin film 34 is bonded as a common electrode on the entire surface of the piezoelectric vibrator 26 on the side of the upper outer electrode 32. Another lead is connected to the conductive thin film 34. A conductive acoustic matched layer may be interposed between the piezoelectric vibrator 26 and the conductive thin film 34. A conductive ultrasonic lens may be placed on the conductive thin film 34.

The transmitting/receiving device 20 also includes multiple selector switches 40. A transmitting section 42 is connected to one end of each selector switch 40, and a receiving section 44 is connected to the other end thereof. In this case, a sine-wave generating device, such as a function synthesizer, is used as the transmitting section 42, and a waveform measuring device, such as a digital oscilloscope, is used as the receiving section 44. A common reference potential is used for both the transmitting section 42 and the receiving section 44.

The outer electrode 32 on the bonded side of each of the piezoelectric vibrators 26 in the ultrasonic probe 22 is connected to the midpoint of a selector switch 40 via a lead. A reference potential is applied to the upper outer electrode 32 of each of the piezoelectric vibrators 26 in the ultrasonic probe 22 via another lead.

In normal states, the middle point of each selector switch 40 is not connected to either one end or the other end.

In the transmitting/receiving device 20, first, the middle point of the first selector switch 40 is connected to one end, and the first piezoelectric vibrator 26 is connected to the first transmitting section 42. Then, five cycles of sine waves serving as the resonant frequency for the first piezoelectric vibrator 26 are input from the first transmitting section 42 to the first piezoelectric vibrator 26, and the first piezoelectric vibrator 26 vibrates and emits ultrasonic waves.

Immediately after that, the middle point of the first selector switch 40 is switched to the other end, and the first piezoelectric vibrator 26 is connected to the first receiving section 44. Then, the emitted ultrasonic waves reflected from a surface to be measured are received by the first receiving section 44 via the first piezoelectric vibrator 26. In this case, the time from emission to reception is measured and stored in the first receiving section 44.

When measurement and storage for the first piezoelectric vibrator 26 are completed, similar operations are repeated for the next piezoelectric vibrator 26. When the operations are completed, similar operations are repeated for the third piezoelectric vibrator 26 next thereto.

By performing similar operations for all the piezoelectric vibrators 26, it is possible to detect the unevenness of the surface to be measured opposing the upper surfaces of the piezoelectric vibrators 26 of the ultrasonic probe 22 based on the differences among the times which are taken to receive the reflected waves.

Figure 9:
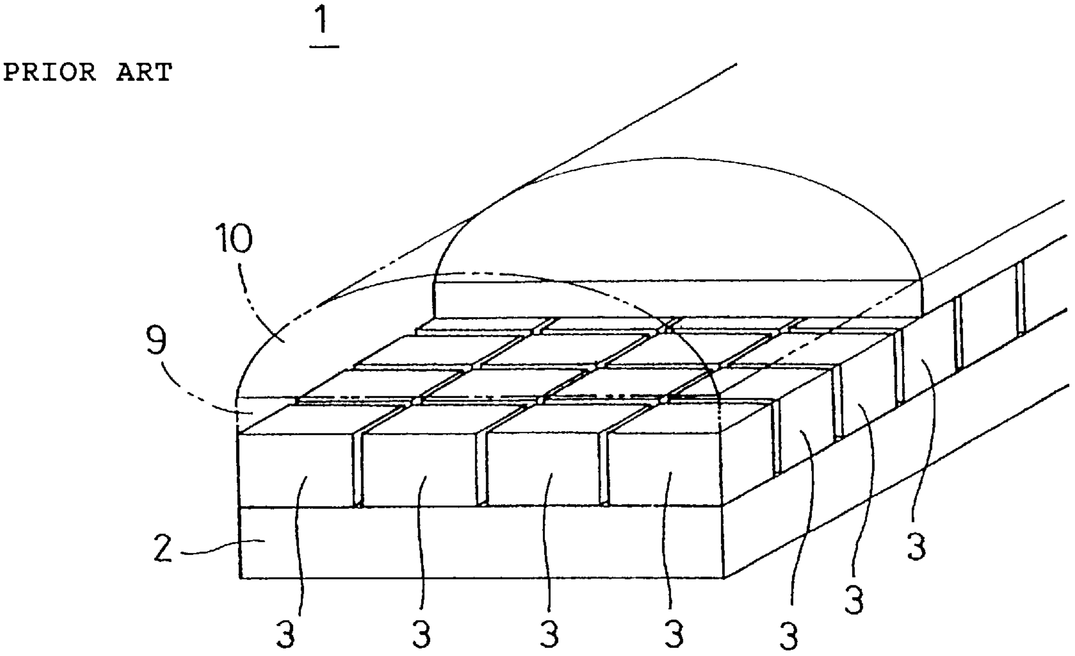
FIG. 9 PRIOR ART
FIG. 9 is a perspective view showing the principal part of an ultrasonic probe used in a conventional ultrasonic diagnostic device.
Figure 10:
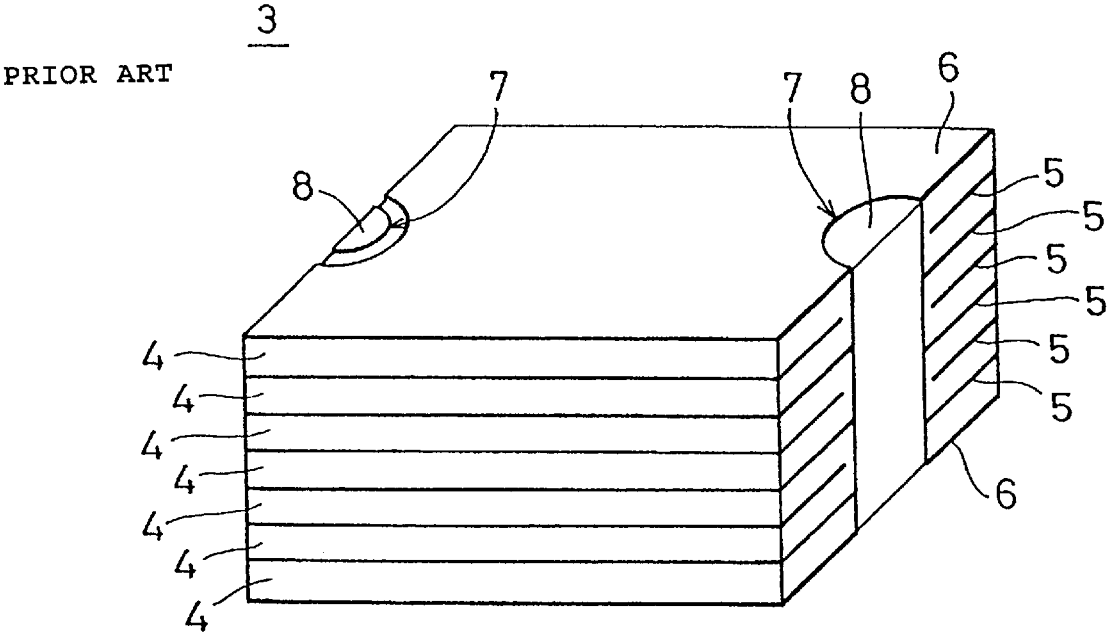
FIG. 10 PRIOR ART
FIG. 10 is a perspective view of a piezoelectric vibrator used in the ultrasonic probe shown in FIG. 9.
Figure 11:
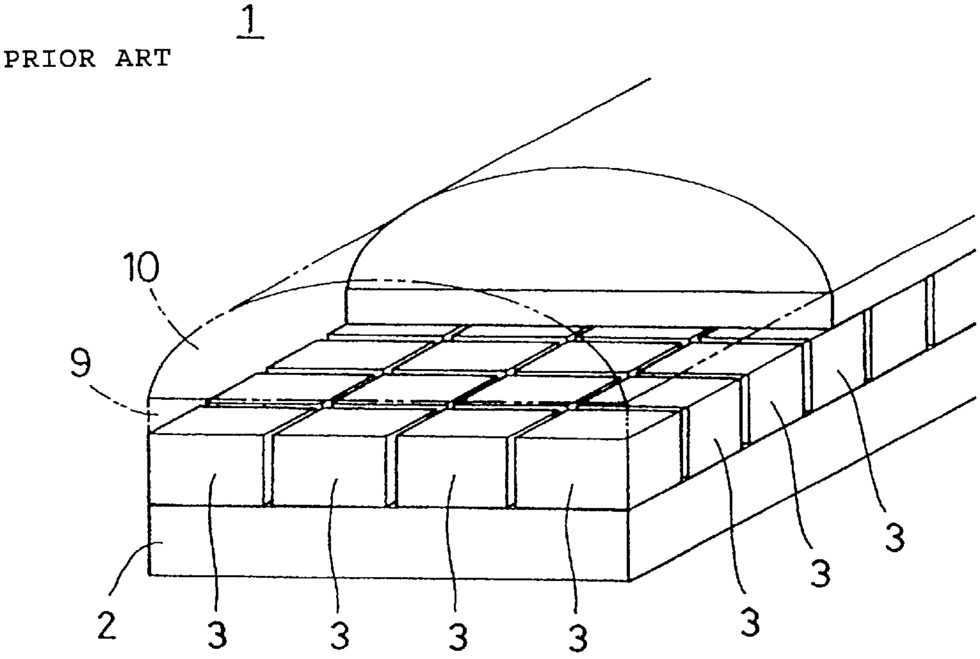
FIG. 11 PRIOR ART
FIG. 11 is a perspective view showing the principal part of another ultrasonic probe.
Figure 12:
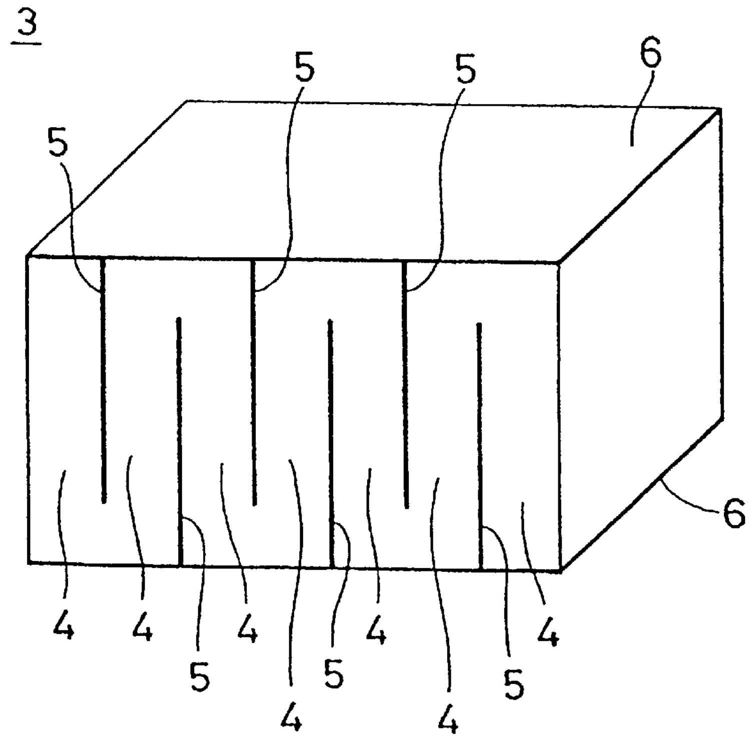
FIG. 12 PRIOR ART
FIG. 12 is a perspective view of a piezoelectric vibrator used in the ultrasonic probe shown in FIG. 11.

Since the piezoelectric vibrators 26 having the layered structure are used in the ultrasonic probe 22 of the transmitting/receiving device 20 in order to achieve two-dimensional processing by the ultrasonic probe with three-dimensional image formation and increased resolution, it is possible to obtain impedance matching and wave reception sensitivity similar to those in the ultrasonic probe 1 shown in FIGS. 9 and 11, and to improve performance.

Furthermore, since the piezoelectric vibrators 26 having the layered structure, in which layers are stacked in the direction shown in FIG. 3, are used in the transmitting/receiving device 20, complicated processes and a high machining accuracy, such as the formation of via holes and the cutting method for via holes, are unnecessary. This simplifies the processes and eliminates a high machining accuracy when producing the piezoelectric vibrators 26.

Since the piezoelectric layers 28 and the inner electrodes 30 of each piezoelectric vibrator 26 are stacked in parallel with the principal surface of the substrate 24 and in the direction crossing two adjoining surfaces of the piezoelectric vibrator 26, the area of the end faces (upper and lower surfaces in FIG. 3) of the outermost piezoelectric layers 28 of the piezoelectric vibrator 26, which do not show piezoelectricity, is reduced. For this reason, the factor that damps vibration by the outermost piezoelectric layers 28 in the piezoelectric vibrator 26 is reduced, and the influence of variations in thickness of the outermost piezoelectric layers 28 among the piezoelectric vibrators 26 on the characteristics of the piezoelectric vibrators 26 is also reduced. Therefore, variations in the characteristics among the piezoelectric vibrators 26 are limited.

Next, a description will be given of variations among the piezoelectric vibrators, in which the piezoelectric layers and the inner electrodes are stacked in parallel with the side faces of the piezoelectric vibrators, as in the ultrasonic probe shown in FIG. 11, and variations among the piezoelectric vibrators, in which the piezoelectric layers and the inner electrodes are stacked in the direction crossing two adjoining side faces of the piezoelectric vibrators, as in the ultrasonic probe shown in FIG. 2.

First, a method for producing an ultrasonic probe will be described briefly.

Figure 4:
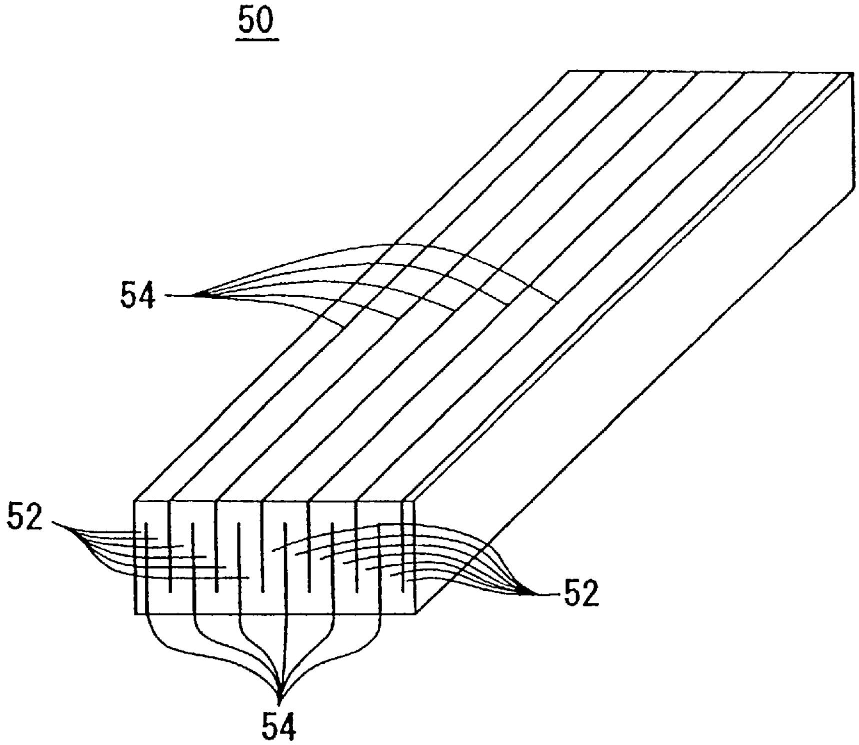
FIG. 4 is a perspective view of a motherboard for producing ultrasonic probes.

FIG. 4 is a perspective view of a motherboard for producing ultrasonic probes. A motherboard 50 has, for example, a length of 12 mm, a width of 4 mm, and a thickness of 0.7 mm. The motherboard 50 is formed by, for example, stacking ninety-five piezoelectric layers 52 of 0.7 mm×12 mm×42 μm. In this case, inner electrodes 54 are formed between the piezoelectric layers 52. When outer electrodes are formed on the entire front and rear surfaces of the motherboard 50, the inner electrodes 54 are alternately connected to the front-side outer electrode and to the rear-side outer electrode.

Figure 5:
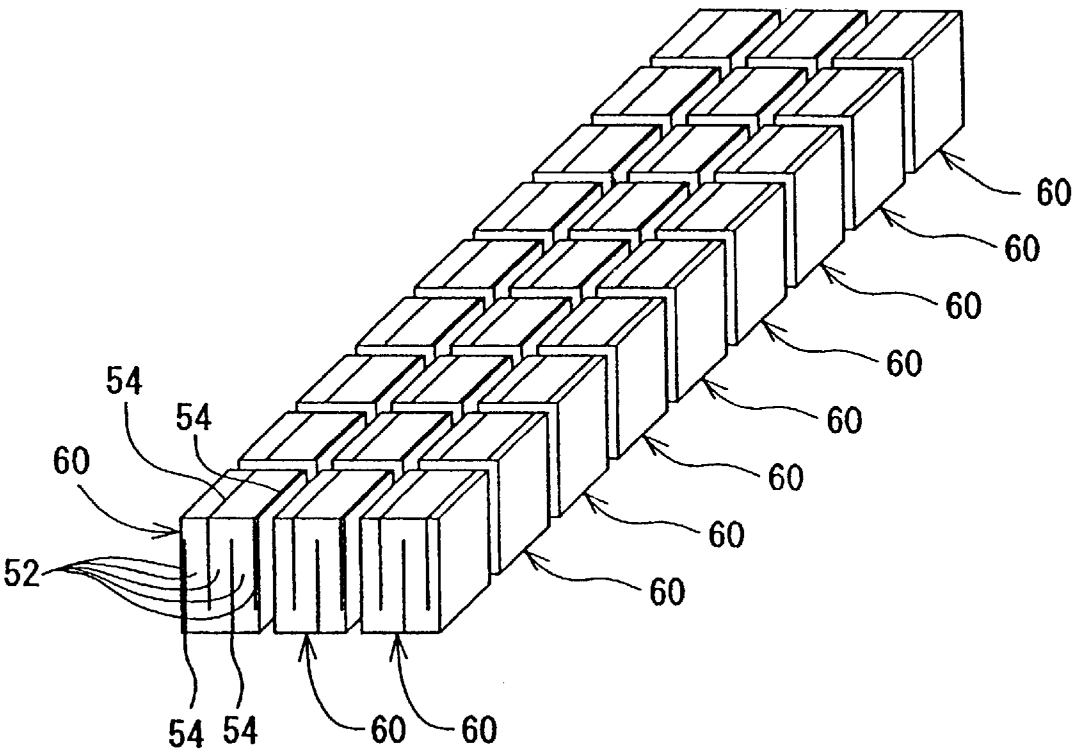
FIG. 5 is a perspective view showing a state in which the motherboard shown in FIG. 4 is cut in the stacking direction.

The motherboard 50 is bonded onto one principal surface of a substrate and is cut into a matrix at a fixed pitch, as shown in FIG. 5, thereby forming piezoelectric vibrators 60 and producing an ultrasonic probe. Outer electrodes are formed on the entire front and rear surfaces of the motherboard 50 before the motherboard 50 is bonded onto the substrate.

In a case in which piezoelectric layers and inner electrodes of the piezoelectric vibrators are stacked in parallel with the side faces of the piezoelectric vibrators, as in the ultrasonic probe shown in FIG. 11, since the pitch, at which the motherboard 50 is cut, is not equal to an integral multiple of the thickness of the piezoelectric layers 52, the positions of the inner electrodes 54 vary among the piezoelectric vibrators 60. When the positions of the inner electrodes 54 vary in this way, the piezoelectric vibrators 60 including different numbers of piezoelectric layers 52 are produced. As a result, piezoelectric vibrators 60 having the capacitance, which is different by, for example, 10% or more, are mixed, and this produces variations in the characteristics, such as wave reception sensitivity.

In contrast, in a case in which piezoelectric layers and inner electrodes of the piezoelectric vibrators are stacked in the direction crossing two adjoining side faces of the piezoelectric vibrators, as in the ultrasonic probe shown in FIG. 2, even when the pitch at which the motherboard 50 is cut is not equal to an integral multiple of the thickness of the piezoelectric layers 52, since the area of the outermost piezoelectric layers of the piezoelectric vibrators, which do not show piezoelectricity, is reduced, the factor that damps vibration by the outermost piezoelectric layers in the piezoelectric vibrator is reduced, and the influence of variations in thickness of the outermost piezoelectric layers among the piezoelectric vibrators on the characteristics of the piezoelectric vibrators is reduced. Therefore, variations in the characteristics among the piezoelectric vibrators are limited.

Next, variations among the piezoelectric vibrators in the ultrasonic probe will be described with concrete numeric values.

Figure 6:
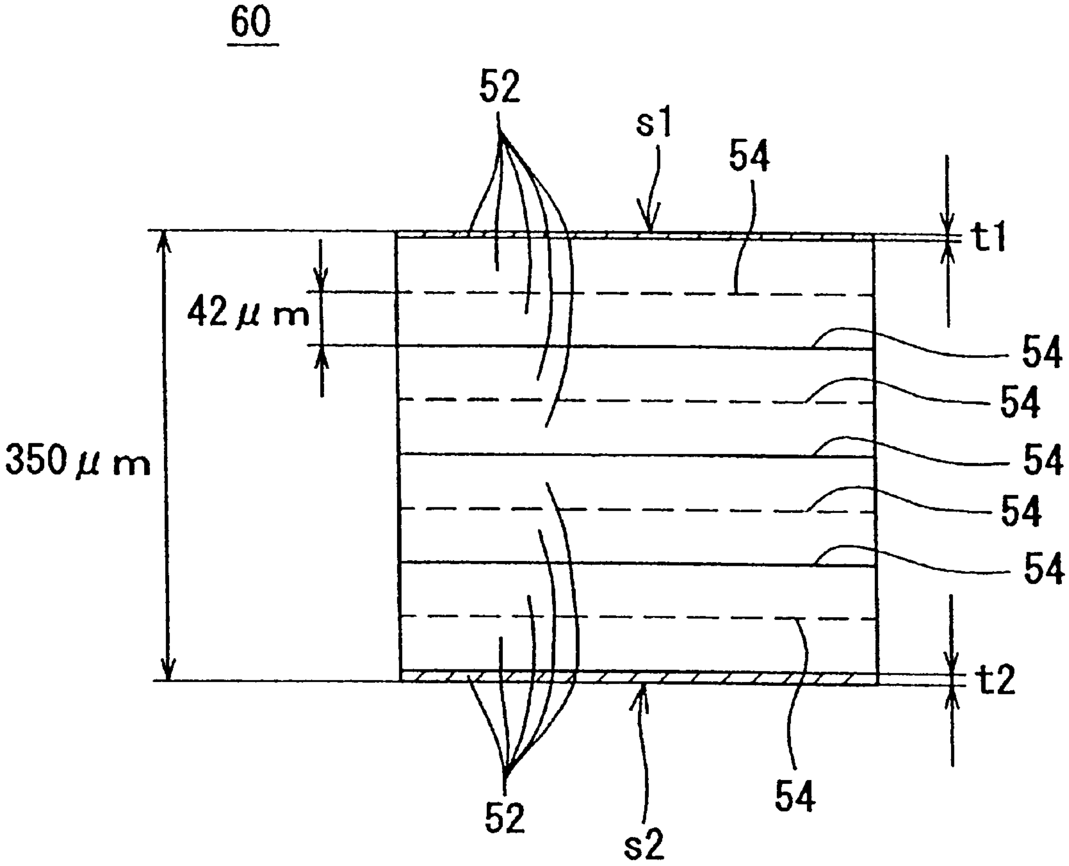
FIG. 6 is a top view of a piezoelectric vibrator in an ultrasonic probe.

First, a description will be given of piezoelectric vibrators 60 formed by, for example, cutting a motherboard into a matrix in the stacking direction. FIG. 6 shows the upper surface of the piezoelectric vibrator 60 in this example. The piezoelectric vibrator 60 has, for example, a length of 350 μm and a width of 350 μm. Piezoelectric layers 52 have, for example, a thickness of 42 μm. As shown in FIG. 6, the thickness of the outermost piezoelectric layer at one end is designated t1, the area thereof is designated s1, the thickness of the outermost piezoelectric layer 52 at the other end is designated t2, and the area thereof is designated s2.

While the pitch at which the motherboard is cut is approximately 350 μm in this example, it is not equal to an integral multiple of the thickness of the piezoelectric layers 52.

For this reason, the positions of the inner electrodes vary among the piezoelectric vibrators 60.

In the piezoelectric vibrator 60 shown in FIG. 6, when the number of middle active piezoelectric layers 52 is eight, that is, when $0<t1<14$ μm, $t1+t2=350-42\times 8=14$ μm, and therefore, $t2=14-t1$.

For this reason, the sum $s1+s2$ of the areas of the outermost piezoelectric layers 52 at both ends, which cannot be polarized, is equal to $(t1+t2)\times 350=14\times 350=4900$ [μm×μm].

In the piezoelectric vibrator 60 shown in FIG. 6, when the number of middle active piezoelectric layers 52 is seven, that is, when $14\ \mu m \leqq t1 \leqq 42\ \mu m$, $t1+t2=350-42\times 7=56$ μm, and therefore, $t2=56-t1$.

For this reason, the sum $s1+s2$ of the areas of the outermost piezoelectric layers 52 at both ends, which cannot be polarized, is equal to $(t1+t2)\times 350=56\times 350=19600$ [μm×μm].

When 42 μm<t1, the sum of the areas of the outermost piezoelectric layers 52 at both ends, which cannot be polarized, are 4900 [μm×μm], in a manner similar to that in the case in which the number of middle active piezoelectric layers 52 is eight.

Figure 7:
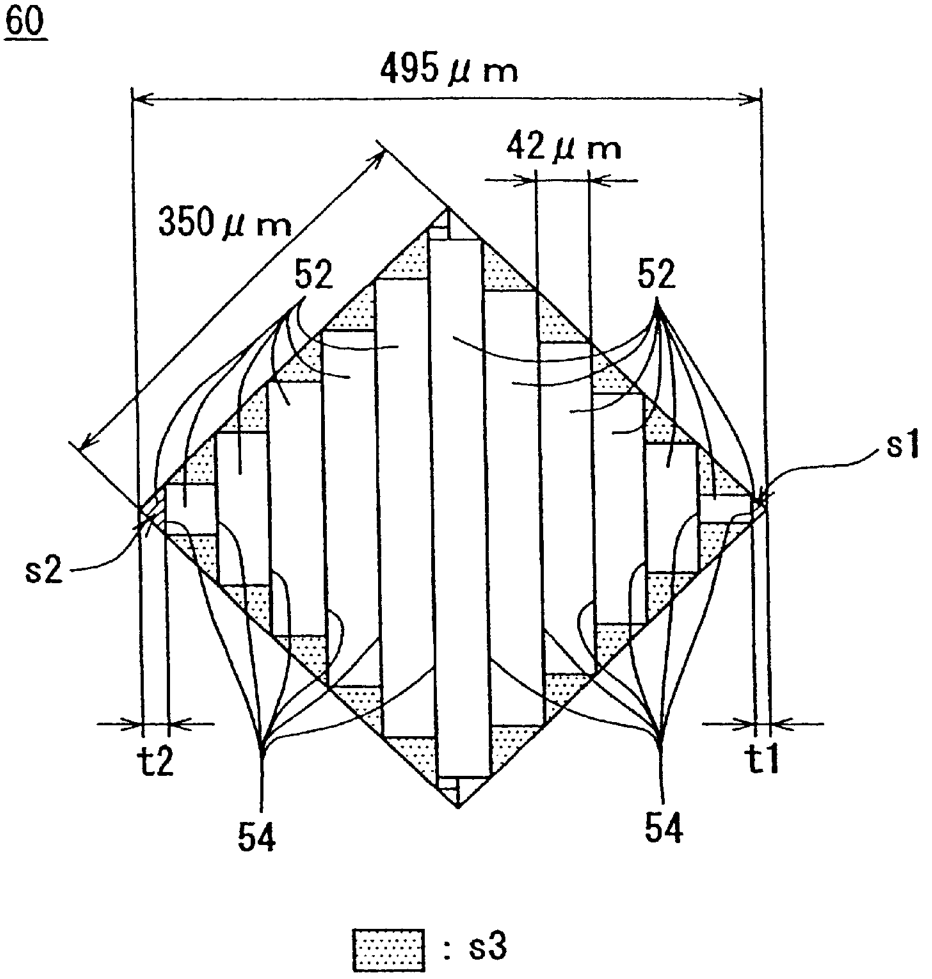
FIG. 7 is a top view of a piezoelectric vibrator in an ultrasonic probe.

Next, a description will be given of a piezoelectric vibrator 60 formed by, for example, cutting a motherboard, which is inclined at an angle of 45° to the stacking direction, into a matrix. FIG. 7 shows the upper surface of the piezoelectric vibrator 60 in this example. The piezoelectric vibrator 60 has, for example, a length of 350 μm, a width of 350 μm, and a diagonal length of 495 μm. Piezoelectric layers 52 have, for example, a thickness of 42 μm. As shown in FIG. 7, the height of the outermost piezoelectric layer 52 at one end, which is shaped like a right-angled isosceles triangle, is designated ti, the area thereof is designated s1, the height of the outermost piezoelectric layer 52 at the other end, which is shaped like a right-angled isosceles triangle, is designated t2, and the area thereof is designated s2.

Since the length in the stacking direction is increased in this example, the number of middle active piezoelectric layers 52 is eleven or ten.

In the piezoelectric vibrator 60 shown in FIG. 7, when the number of middle active piezoelectric layers 52 is eleven, that is, when $0<t1<33$ μm, $t1+t2=495-42\times 11=33$ μm, and therefore, $t2=33-t1$.

For this reason, the sum $s1+s2$ of the areas of the outermost piezoelectric layers 52 at both ends, which cannot be polarized, is equal to $1/2\times t1\times(2\times t1)+1/2\times t2\times(2\times t2)=t1^2+t2^2=t1^2+(33-t1)^2=2\times t1^2-66t1+33^2$.

When the motherboard is thus cut diagonally, not only the outermost piezoelectric layers 52, but also both ends of each piezoelectric layer 52 cannot be polarized. When it is assumed that the area of the unpolarized portions of the active piezoelectric layers 52 except the center piezoelectric layer is designated s3, $s3=42^2\times 10$.

When $A=33^2+42^2\times 10$, $s1+s2+s3=2\times t1^2-66t1+A$.

Figure 8:
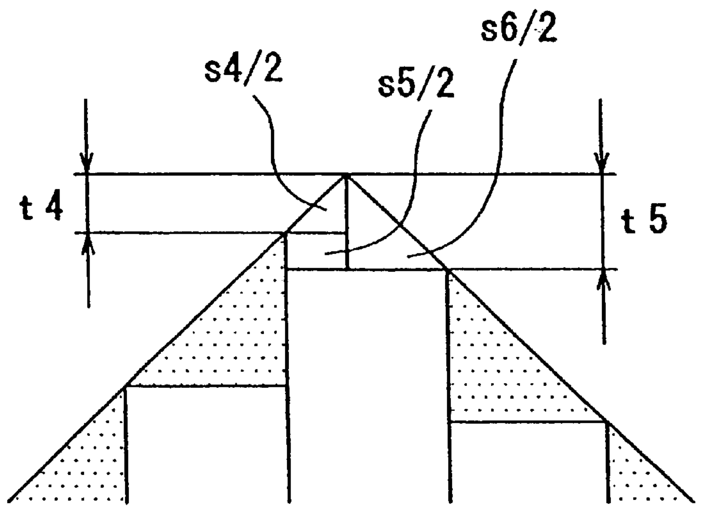
FIG. 8 is a view illustrating the corner of the upper surface of the piezoelectric vibrator in the ultrasonic probe.

Next, the area of the unpolarized portions of the center piezoelectric layer 52 is found. FIG. 8 is an enlarged view of one corner of the center piezoelectric layer 52 At this corner, the unpolarized portion is divided into two triangles and one small rectangle. The area of the smaller triangle is designated s4/2, the area of the larger triangle is designated s5/2, and the area of the remaining rectangle is designated s6/2.

When the height of the triangle s4 is designated t4, $t4=21\pm(16.5-t1)$.

Furthermore, $s4+s5+s6=t4^2+(42-t4)^2+(42-2t4)\times t4\times 2=-2t4^2+42^2$.

When $B=A+42^2$ and the total area of the unpolarized portions is designated as s, $s=2\times t1^2-66\times t1-2\times t4^2+B$.

When $0\leqq t1\leqq 16.5$ μm, $t4=21-(16.5-t1)=4.5+t1$, and $s=-66\times t1-2\times 9\times t1-2\times 4.5^2+B=-84\times t1-2\times 4.5^2+B$.

When 16.5 μm<t1≦33 μm, $t4=21-(t1-16.5)=37.5-t1$, and $s=-66\times t1+2\times 75\times t1-2\times 37.5^2+B=84\times t1-2\times 37.5^2+B$.

Therefore, the minimum value of the area s of the unpolarized portions is 19066.5 [μm×μm] when t1=16.5 μm.

In the piezoelectric vibrator 60 shown in FIG. 7, when the number of middle active piezoelectric layers 52 is ten, that is, when $33\ \mu m<t1<42\ \mu m$, $t2=495-42\times 10-t1=75-t1$.

The sum $s1+s2$ of the areas of the outermost piezoelectric layers 52 at both ends is equal to $t1^2+t2^2=2t1^2-150t1+75^2$.

In this case, unpolarized portions also exist at both ends of the active piezoelectric layers 52 except for the center piezoelectric layer 52. In the active piezoelectric layers 52 except for the center piezoelectric layer, fixed triangles are formed at both ends thereof. When the area of these portions is designated s3, $s3=42^2\times 9$, and $D=75^2+42^2\times 9$.

Unpolarized portions each composed of two triangles and one rectangle remain only at both ends of the center piezoelectric layer 52.

When $E=D+42^2$, the total area s of the unpolarized portions is equal to $2\times t1^2-150\times t1-2t4^2+E$.

In this time, $t4=37.5-t1$.

Therefore, $s=2\times t1^2-150\times t1-2\times t1^2+2\times 75\times t1-2\times 37.5^2+E=-2\times 37.5^2+E=20452.5$ [μm×μm], which is fixed.

While the variations in area among the unpolarized portions have been examined above, they are variations among the polarized portions from an opposite point of view. The variations refer to variations in capacitance, and appear as variations in wave reception sensitivity.

As described above, in the case in which the motherboard is cut in the stacking direction, the minimum value of the area of the polarized portions is 102900 [μm×μm] (350×350−19600), and the maximum value thereof is 117600 [μm×μm] (350×350−4900). The difference therebetween is 14700 [μm×μm]. The median value and the differences therefrom are simply expressed as 110250±7350 [μm×μm] (±7%).

In contrast, in the case in which the motherboard is cut at an angle 45° to the stacking direction, as described above, the minimum value of the area of the polarized portions is 102047.5 [μm×μm] (350×350−20452.5), and the maximum value thereof is 103433.5 [μm×μm] (350×350−19066.5).

The difference therebetween is 1386 [μm×μm]. The median value and the differences therefrom are simply expressed as 102740.5±693 [μm×μm] (±0.7%).

The above examples show that the variations are large, ±7%, when the motherboard is cut in the stacking direction, whereas they fall in the range of ±0.7% when the motherboard is cut at an angle of 45° to the stacking direction.

While the piezoelectric vibrators 26 of a special size are used in the ultrasonic probe 22 of the above transmitting/receiving device 20, piezoelectric vibrators of another size may be used.

While the alternate inner electrodes 30 are connected to the outer electrodes 32 in the above piezoelectric vibrator 26, inner electrodes which are not connected to the outer electrodes 32 may be formed.

The present invention is applied not only to the sensor array, such as an ultrasonic probe, used in the transmitting/receiving device, but also to sensor arrays used in ultrasonic diagnostic devices, ultrasonic microscopes, and metal flaw detectors.

While the present invention has been described with reference to what is presently considered to be the preferred embodiment, it is to be understood that the invention is not limited to the disclosed embodiment. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A sensor array comprising:

a substrate; and a plurality of piezoelectric vibrators having a rectangular parallelepiped shape and fixed in a matrix on a principal surface of the substrate, wherein each of said piezoelectric vibrators includes a plurality of piezoelectric layers stacked in a direction parallel to said principal surface of said substrate, at least some of said piezoelectric layers extend in a direction crossing two adjoining side faces of said piezoelectric vibrator, inner electrodes disposed between said piezoelectric layers, and outer electrodes provided on end faces of said piezoelectric layers.

2. A sensor array according to claim 1, wherein said piezoelectric layers extend in a direction that crosses the two adjoining side faces of said piezoelectric vibrator at approximately 45° with respect to directions in which the adjoining side faces extend.

3. A transmitting/receiving device comprising a sensor array according to claim 1 or 2.

4. A sensor array according to claim 1, wherein adjacent pairs of the plurality of piezoelectric layers are alternately polarized in opposite directions.

5. A sensor array according to claim 1, wherein a conductive thin film is provided on at least one of said outer electrodes to define a common electrode.

* * * * *